(12) United States Patent
Yang et al.

(10) Patent No.: US 6,953,959 B2
(45) Date of Patent: Oct. 11, 2005

(54) INTEGRATED CIRCUIT DEVICES INCLUDING SELF-ALIGNED CONTACTS WITH INCREASED ALIGNMENT MARGIN

(75) Inventors: Won-suk Yang, Kyungki-do (KR); Ki-nam Kim, Kyungki-do (KR)

(73) Assignee: Samsung Electronics Co., Ltd. (KR)

(*) Notice: Subject to any disclaimer, the term of this patent is extended or adjusted under 35 U.S.C. 154(b) by 27 days.

(21) Appl. No.: 10/156,477

(22) Filed: May 28, 2002

(65) Prior Publication Data
US 2002/0179966 A1 Dec. 5, 2002

(30) Foreign Application Priority Data
May 29, 2001 (KR) .......................... 2001-29731

(51) Int. Cl.[7] .................. H01L 27/108; H01L 29/00
(52) U.S. Cl. ........................ 257/296; 257/520
(58) Field of Search ....................... 257/296, 306, 257/520

(56) References Cited

U.S. PATENT DOCUMENTS 5,877,522 A * 3/1999 Kasai .................. 257/306
6,320,240 B1 * 11/2001 Miyoshi ................ 257/520

FOREIGN PATENT DOCUMENTS

JP 20000269333 11/2001
KR 2000-66345 11/2000

* cited by examiner

Primary Examiner—Amih Zarabian
Assistant Examiner—Kiesha Rose
(74) Attorney, Agent, or Firm—Myers Bigel Sibley & Sajovec PA

(57) ABSTRACT

An integrated circuit device, e.g., a memory device, includes a substrate, and a plurality of rows of active regions in the substrate, the active regions arranged in a staggered pattern such that active regions of a first row are aligned with portions of an isolation region separating active regions of an adjacent second row. Source and drain regions are in the active regions and are arranged such that each active region comprises a drain region disposed between two source regions. A plurality of word line structures are on the substrate, arranged transverse to the rows of active regions such that that word line structures cross the active regions between the source regions and the drain regions. Respective rows of conductive pads are disposed between respective adjacent word lines structures, including first conductive pads on the source regions, second conductive pads on the drain regions, and third conductive on isolation regions separating active regions. A plurality of bit line structures are on the substrate, extending transverse to the word line structures and contacting the second conductive pads. Related methods of fabrication are also described.

13 Claims, 17 Drawing Sheets

INTEGRATED CIRCUIT DEVICES INCLUDING SELF-ALIGNED CONTACTS WITH INCREASED ALIGNMENT MARGIN

RELATED APPLICATION

This application claims priority to Korean Patent Application No. 2001-29731, filed on May 29, 2001, the contents of which are herein incorporated by reference in their entirety.

FIELD OF THE INVENTION

The present invention relates to integrated circuit devices and methods for fabricating the same, and more particularly, to integrated circuit devices, such as integrated circuit memory devices, with self-aligned contact (SAC) pads and methods of fabricating the same.

As memory devices are designed to operate at higher speeds and to have a larger storage capacity, the integration density of integrated circuit memory devices has generally increased. For example, as the integration density of dynamic random access memories (DRAMs) has increased to more than a gigabyte, the design rule has decreased below 0.18 $\mu$m. Horizontal gaps between individual devices, vertical gaps between layers, and misalignment margins have typically been reduced in proportion to the decreasing design rule. Accordingly, defects, such as poor contact filling or misalignment, may occur.

A conventional integrated circuit memory device employing a self-aligned contact method will be described with reference to FIGS. 1 and 2. Referring to FIGS. 1 and 2, an isolation layer 12 is formed on a semiconductor substrate 10, thereby defining active regions 11. Peripheral circuit regions (not shown) and core regions (not shown) may also be defined by the isolation layer 12. Next, a gate insulating layer 13, a gate conductive layer 14, and a capping layer 15 are sequentially deposited on the semiconductor substrate 10. Predetermined portions of the capping layer 15 and the gate conductive layer 14 are patterned. Spacers 16 are formed at the sidewalls of the remaining portions of the capping layer 15 and the remaining gate conductive layer 14, thereby forming word line structures 17.

As shown in FIG. 1, the word line structures 17 extend in a Y direction across the active regions 11, and are spaced a predetermined distance away from one another. A pair of word line structures 17 crosses each active region 11. Impurities for a source and a drain are implanted in the active region 11 on both sides of each of the word line structures 17, thereby forming a source region 18a and a drain region 18b in each active region 11.

An etch stopper (not shown) and an interlayer insulating layer 19 are sequentially deposited on the semiconductor substrate. The interlayer insulating layer 19 fills spaces between adjacent word line structures 17. The interlayer insulating layer 19 and the etch stopper are etched to expose the source and drain regions 18a and 18b. Then, a conductive polysilicon layer (not shown) is deposited on the semiconductor substrate 10 to contact the exposed source and drain regions 18a and 18b. The polysilicon layer is preferably deposited to a thickness sufficient to fill spaces between the adjacent word line structures 17. The polysilicon layer is chemically and mechanically polished until the interlayer insulating layer 19 is exposed, thereby forming self-aligned contact (SAC) pads 20a and 20b in contact with the source and drain regions 18a and 18b, respectively. The self-aligned contact pads 20b in contact with the drain regions 18b partially occupy spaces 21 between the active regions 11, as bit lines (not shown) will be arranged to be perpendicular to the word line structures 17 in the spaces 21 between the active regions 11. The self-aligned contact pad 20b in contact with the drain region 18b will be in contact with the bit lines (not shown), and the self-aligned contact pad 20a in contact with the source region 18a will be in contact with a storage node electrode.

Such a conventional memory structure may have the following problems: Even though the contact pads 20a and 20b are self-aligned, it may be difficult to precisely align the openings at which the self-aligned contact pads 20a and 20b will be formed because the integration density of the memory device. Thus, adjacent self-aligned contact pads 20a and 20b may not be completely isolated from each other, and a bridge may occur.

As indicated by "3D" of FIG. 1, the self-aligned contact pads 20a and 20b are three-dimensional structures. If light is simultaneously applied along the three dimensions of the self-aligned contact pads 20a and 20b, an interference effect may occur around corners of the structures. In addition, if light is applied in three different directions, it may be difficult to focus. Accordingly, it may be difficult to align openings at which self-aligned contact pads will be formed.

In addition, because the size of the self-aligned contact 20a in contact with the source region 18a is different from the size of the self-aligned contact 20b in contact with the drain region 18b, it may be difficult to uniformly control the degree to which the interlayer insulating layer 19 is etched in order to form openings for the contacts. In some conventional memory devices, only the regions at which the self-aligned contact pads 20a and 20b will be formed are opened before forming the self-aligned contact pads 20a and 20b. Due to the aspect ratio of the word line structures 17, voids may be formed in the interlayer insulating layer 19 filling the space between the word line structures 17. The voids may become larger during formation of the openings for the self-aligned contact regions. During forming the self-aligned contact pads 20a and 20b, a polysilicon layer used to form the self-aligned contact pads 20a and 20b may fill the voids, and thus parasitic conductive lines (not shown) arranged parallel to word lines between the word line structures 17 may be generated. Because such parasitic conductive lines exist in the interlayer insulating layer 19, it may be difficult to detect them through superficial observation of the memory device.

SUMMARY OF THE INVENTION

According to some embodiments of the present invention, an integrated circuit device, such as an integrated circuit memory device, includes a substrate and a plurality of rows of active regions in the substrate, the active regions arranged in a staggered pattern such that active regions of a first row are aligned with portions of an isolation region separating active regions of an adjacent second row. Source and drain regions are in the active regions and are arranged such that each active region comprises a drain region disposed between two source regions. A plurality of word line structures are on the substrate, arranged transverse to the rows of active regions such that that word line structures cross the active regions between the source regions and the drain regions. Respective rows of conductive pads are disposed between respective adjacent word lines structures, including first conductive pads on the source regions, second conductive pads on the drain regions, and third conductive on isolation regions separating active regions. A plurality of bit line structures are on the substrate, extending transverse to the word line structures and contacting the second conductive pads.

According to certain embodiments, an interlayer insulating layer is on the substrate. The bit line structures may comprise a plurality of conductive plugs extending though the interlayer insulating layer to contact the second conductive pads. The conductive plugs may also contact the third conductive pads. The bit line structures may comprise conductive lines disposed on the interlayer insulating layer and in contact with the conductive plugs. Because of the configuration of the device, formation of the conductive plugs may be more easily fabricated and less prone to alignment errors.

In some method embodiments according to the present invention, an isolation region defining a plurality of rows of active regions in a substrate is formed. The active regions are arranged in a staggered pattern such that active regions of a first row are aligned with portions of the isolation region separating active regions of an adjacent second row. A plurality of word line structures is formed on the substrate, arranged transverse to the active regions such that that word line structures cross the active regions between the source regions and the drain regions. Source regions and drain regions are formed in portions of the active regions disposed between the word line structures, the source regions and drain regions arranged such that each active region comprises a drain region disposed between two source regions. Respective rows of conductive pads are formed between respective adjacent word lines structures including first conductive pads on the source regions, second conductive pads on the drain regions, and third conductive pads on portions of the isolation region separating active regions. A plurality of bit line structures is formed on the substrate, extending transverse to the word line structures and contacting the second conductive pads.

An interlayer insulating layer may be formed on the conductive pads. The plurality of bit line structures may be formed by forming a plurality of conductive plugs extending though the interlayer insulating layer to contact the second conductive pads. Forming a plurality of word line structures may comprise forming capped word line structures, each comprising a conductive line on the substrate, a capping layer on the conductive line, and sidewall insulators on sidewalls of the conductive line. Forming source and drain regions in the active regions may comprise implanting impurities into portions of the active regions between the capped word line structures. Forming respective rows of contact pads may comprise forming a plurality of spaced apart insulation regions on the substrate transverse to the capped word line structures, the insulation regions extending to contact portions of the isolation region between the capped word line structures, forming a conductive layer on the substrate, the conductive layer filling gaps between the spaced apart insulation regions and extending to contact the source and drain regions, and removing a portion of the conductive layer to form the rows of contact pads.

Forming a plurality of spaced apart insulation regions may comprise forming a plurality of spaced apart mask regions transverse to the capped word line structures, respective ones of the spaced apart mask regions overlying a respective row of the active regions, forming an insulation layer on the substrate, the insulation layer filling gaps between the spaced apart mask regions, and removing a portion of the insulation layer to form the plurality of spaced apart insulation regions. The mask regions may comprise a photoresist material, and forming an insulation layer may comprise depositing an insulating material at a temperature sufficiently low to maintain integrity of the mask regions. Forming a conductive layer may be preceded by removing the mask regions to expose the source and drain regions, and forming a conductive layer may comprise forming a conductive layer that fills gaps between the insulation regions and contacts the exposed source and drain regions.

DETAILED DESCRIPTION OF THE INVENTION

Figure 1:
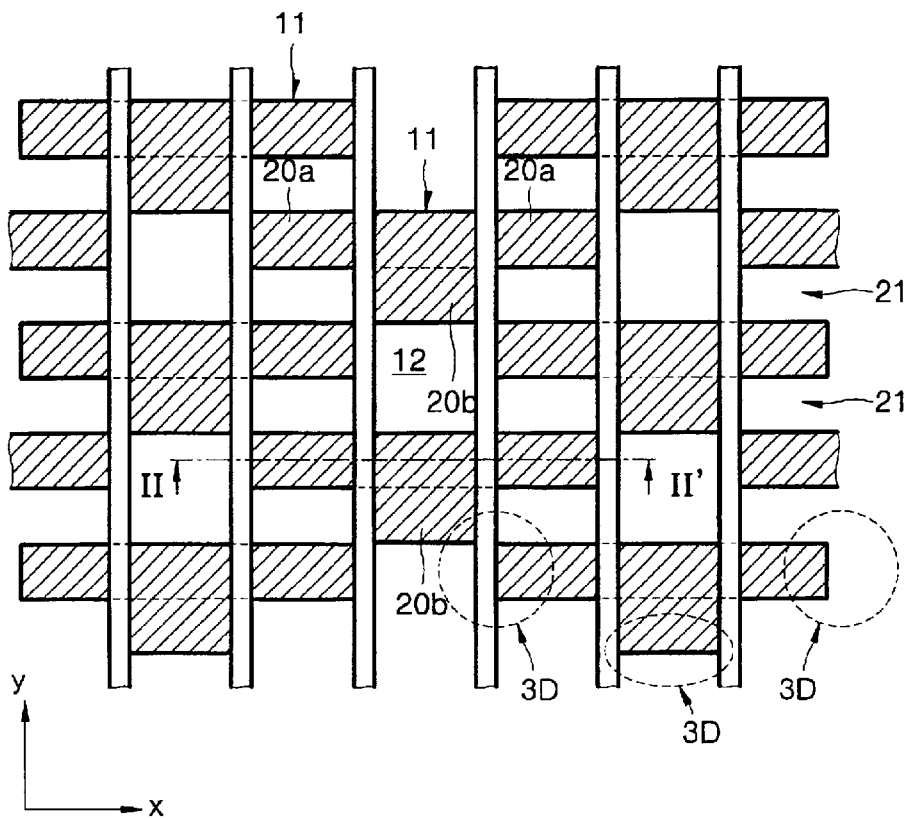
FIG. 1 is a plan view of a conventional memory device.
Figure 2:
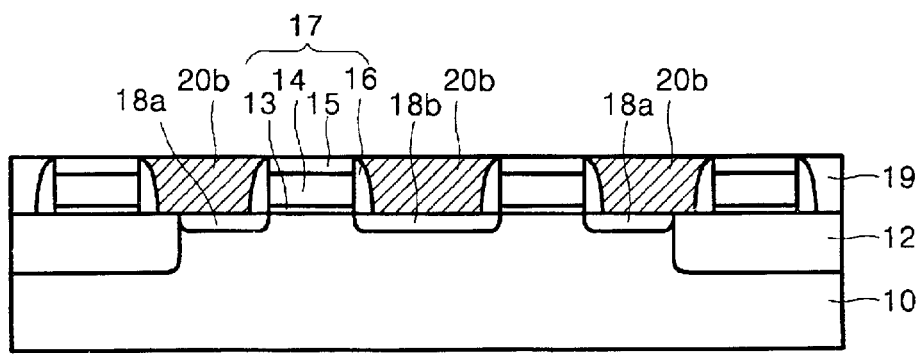
FIG. 2 is a cross-sectional view of the conventional memory device taken along line II–II' of FIG. 1.
Figure 3:
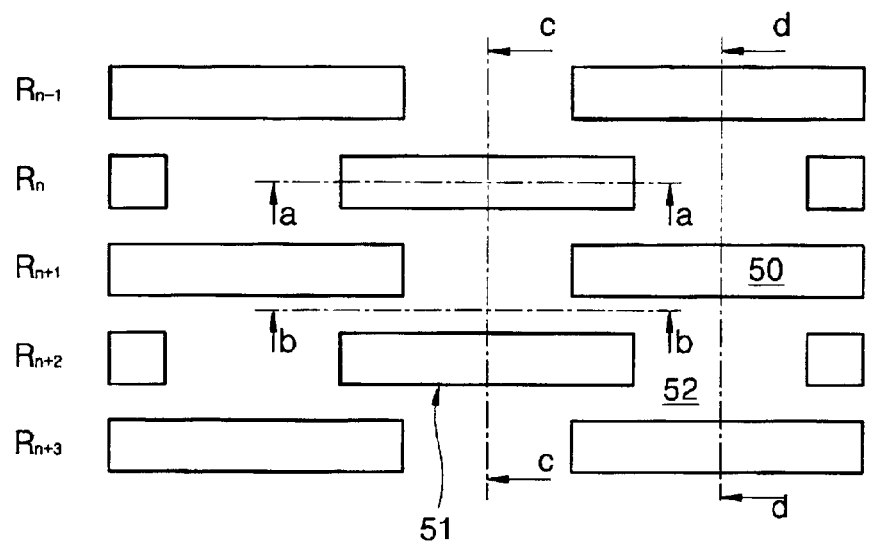
FIGS. 3 through 8 are plan views illustrating fabrication products and operations for manufacturing a memory device according to some embodiments of the present invention.
Figure 4:
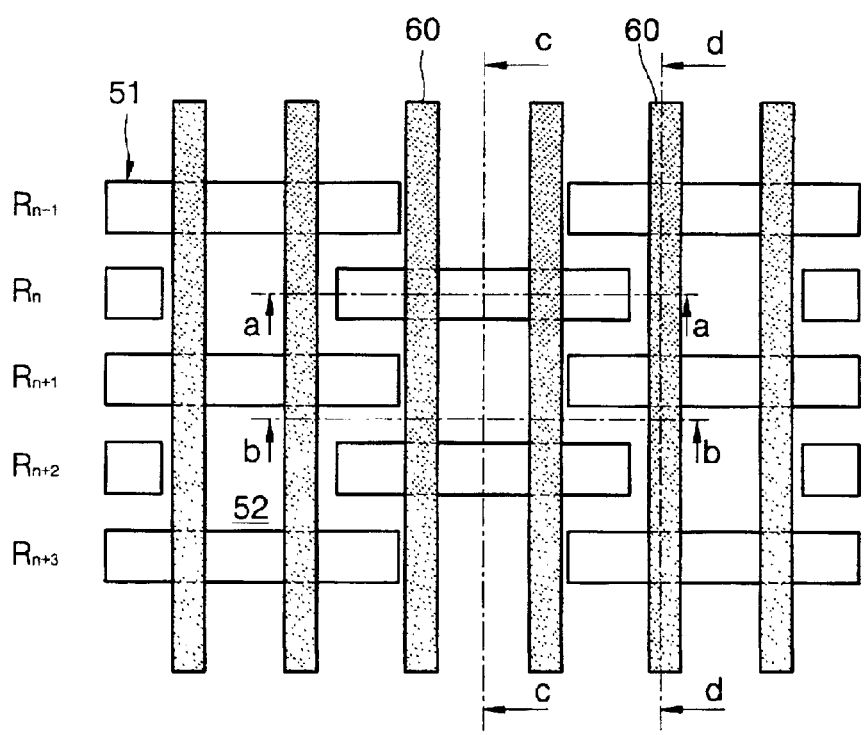
Figure 5:
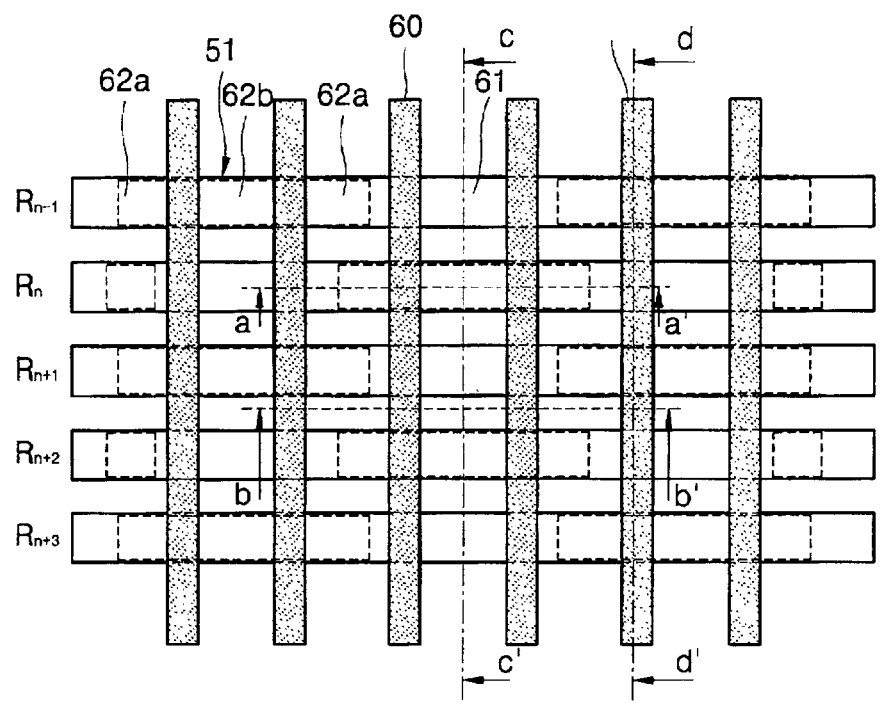
Figure 6:
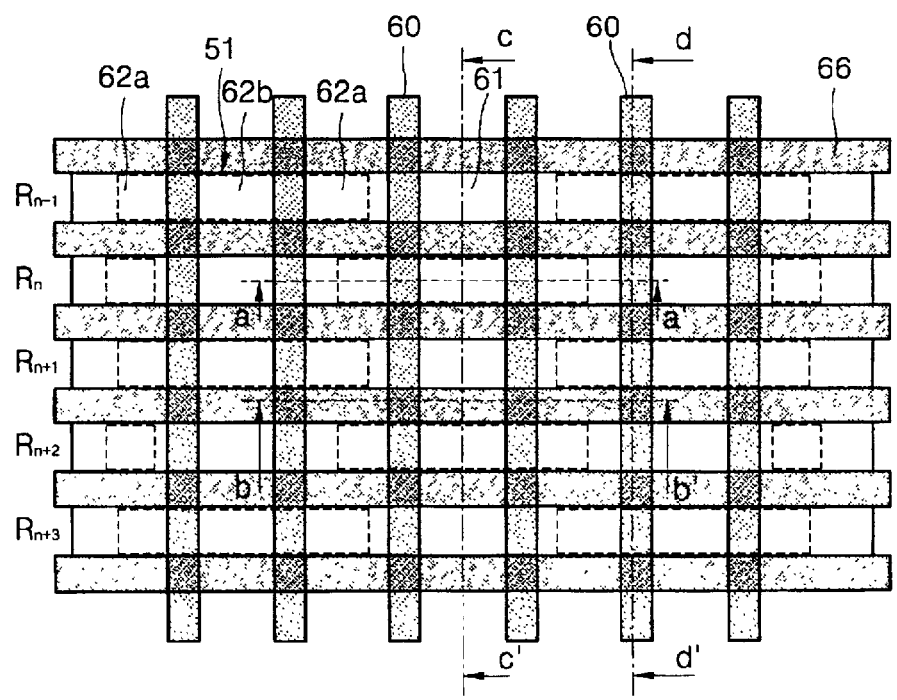

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Referring to FIGS. 3 and 9A through 9D, a semiconductor substrate 50 is prepared. The semiconductor substrate 50 may be, for example, a silicon substrate including p-type or n-type impurities. A well region (not shown) is formed in the semiconductor substrate 50. An isolation layer 52 is formed in the semiconductor substrate 50 using, for example, a shallow trench isolation (STI) method, thereby defining active regions 51 on which devices will be formed. The active regions 51 are arranged in rows Rn−1, Rn, Rn+1, Rn+2, . . . . The rows Rn−1, Rn, Rn+1, Rn+2 . . . are arranged in a staggered fashion, i.e., an active region 51 belonging to a particular row Rn is aligned with a portion of the isolation layer 52 between two adjacent active regions 51 of an adjacent row Rn+1.

Referring to FIGS. 4 and 10A through 10D, a gate insulating layer 54, a conductive layer 56 for a gate electrode, and a capping layer 58 are sequentially deposited on the semiconductor substrate 50. The gate conductive layer 56 may be formed of a doped polysilicon layer. A transition metal suicide layer may be formed between the gate conductive layer 56 and the capping layer 58. The capping layer 58 may be formed of a material, such as a silicon nitride layer SiN or a silicon oxy nitride layer (SiON), having a superior etching selectivity to an interlayer insulating layer to be later formed. Next, the capping layer 58 and the gate conductive layer 56 are patterned into a line shape so as to cross the longitudinal axis of each of the active regions 51. Next, an insulating layer for spacers is deposited on the semiconductor substrate 50. The insulating layer may be formed of the same material as the capping layer 58. The insulating layer is anisotropically etched, thereby forming insulating spacers 59 at the sides of the gate conductive layer 56 and the capping layer 58.

Structures including the gate insulating layer 54, the gate conductive layer 56, the capping layer 58, and the insulating spacers 59 are referred to herein as word line structures 60. The word line structures 60 are spaced a predetermined distance away from one another in parallel to one another. A pair of word line structures 60 cross each active region 51. The active regions 51 may be each divided into three approximately equal parts.

Referring to FIGS. 5 and 11A through 11D, n-type impurities are implanted in portions of the active regions 51 at either side of each of the word line structures 60, thereby forming source regions 62a and drain regions 62b. A photoresist layer is then deposited to a predetermined thickness on the substrate 50 on which the word line structures 60 are formed. The photoresist layer is deposited to a thickness sufficient to fill spaces between the word line structures 60. The photoresist layer is exposed and developed so that portions 64 of the photoresist layer remain on the rows of the active regions 51. The photoresist patterns 64 cross the word line structures 60 and are spaced a predetermined distance away from one another. The photoresist patterns 64 can be removed without damage to the active regions 51.

Referring to FIGS. 6 and 12A through 12D, an oxide layer 66 is formed on the semiconductor substrate 50. The oxide layer 66 is formed to a thickness sufficient to fill spaces between the photoresist patterns 64, and is preferably deposited at a low temperature, for example at a temperature of 150–250° C. The oxide layer 66 is etched back to expose the photoresist patterns 64, leaving the spaces between the photoresist patterns 64 filled with the oxide layer 66.

Figure 7:
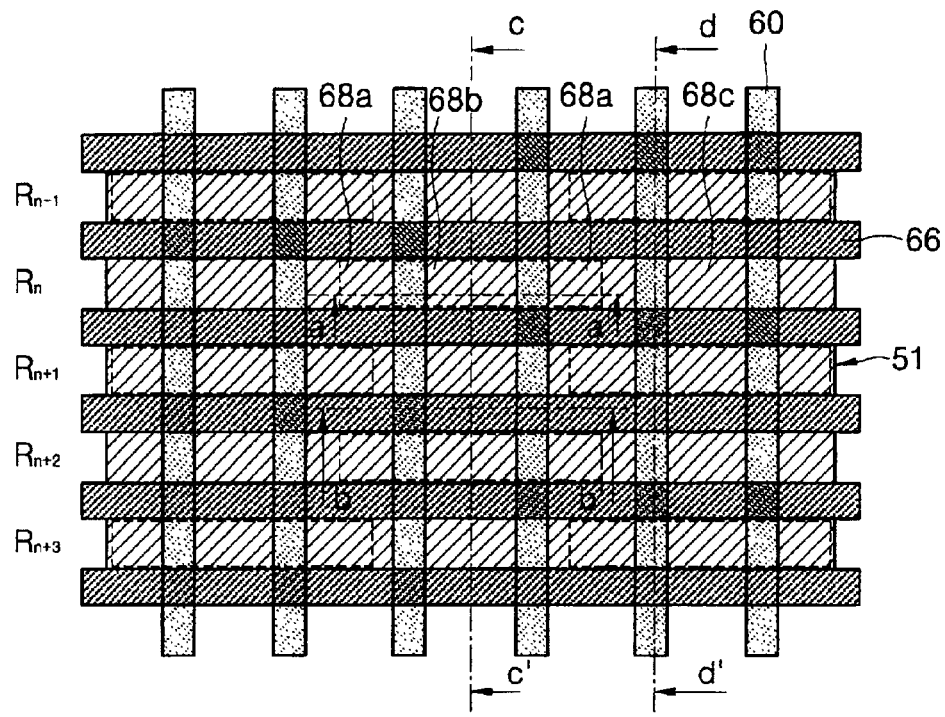
Figure 8:
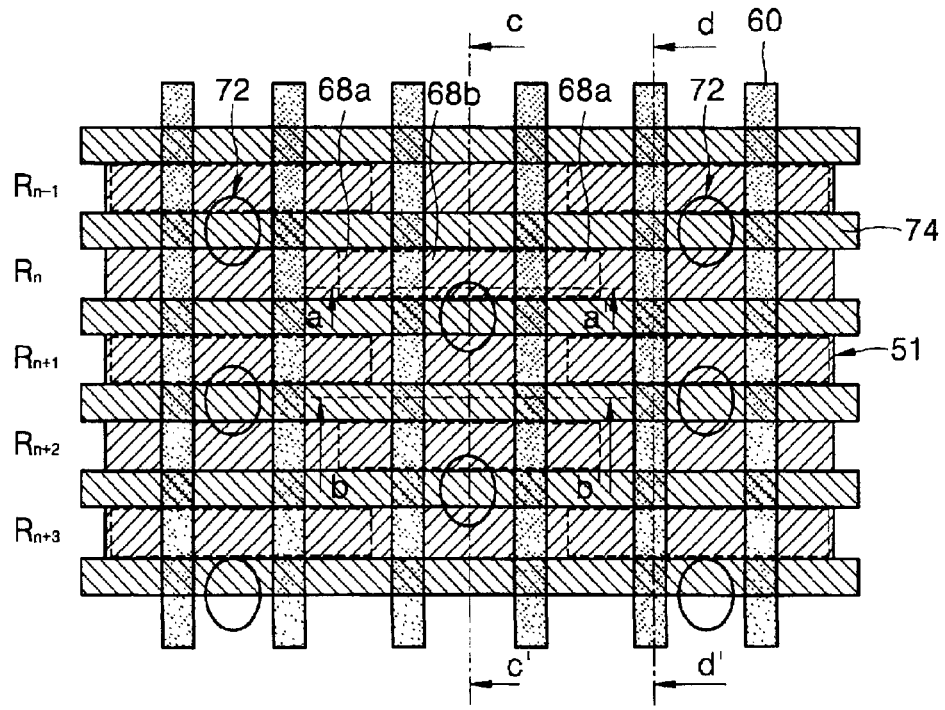
Figure 9A:
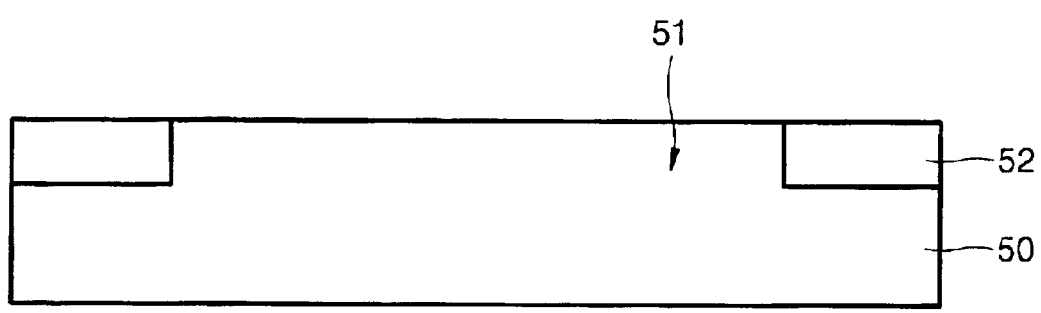
FIGS. 9A through 9D are cross-sectional views of the structure of FIG. 3, taken along lines a–a', b–b', c–c', and d–d', respectively.
Figure 9B:
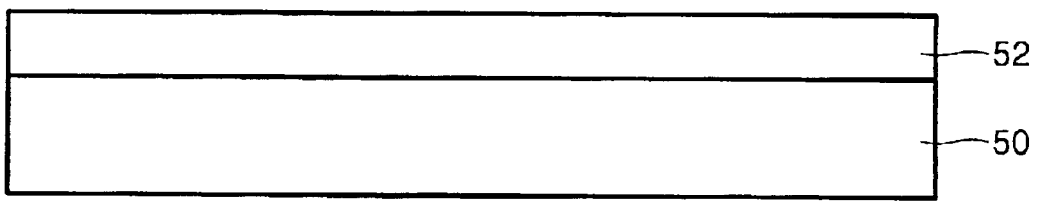
Figure 9C:
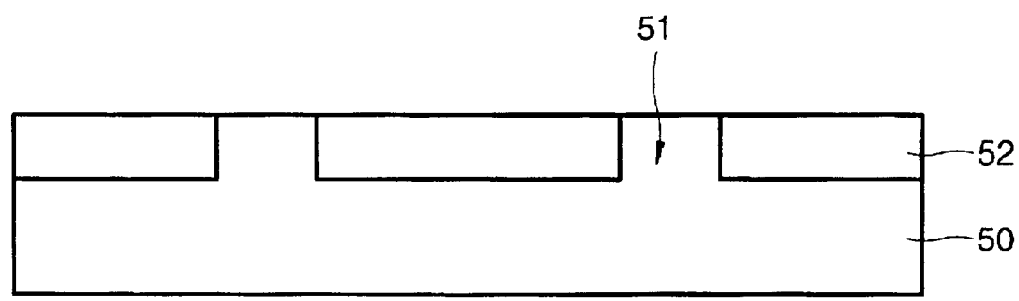
Figure 9D:
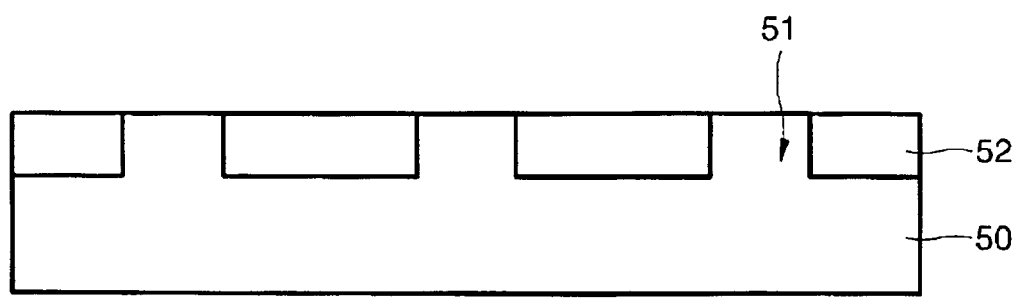
Figure 10A:
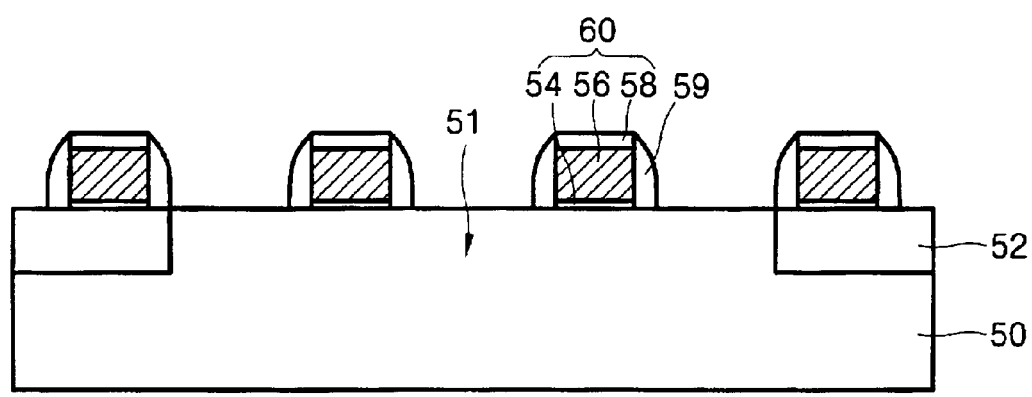
FIGS. 10A through 10D are cross-sectional views of the structure of FIG. 4, taken along lines a–a', b–b', c–c', and d–d', respectively.
Figure 10B:
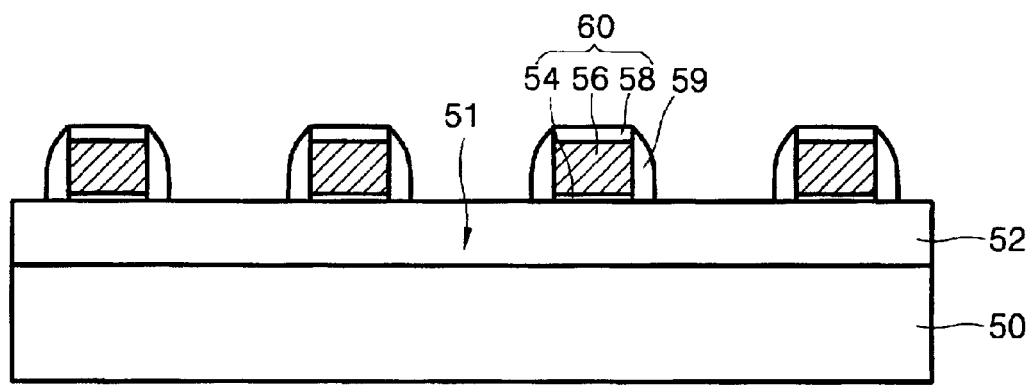
Figure 10C:
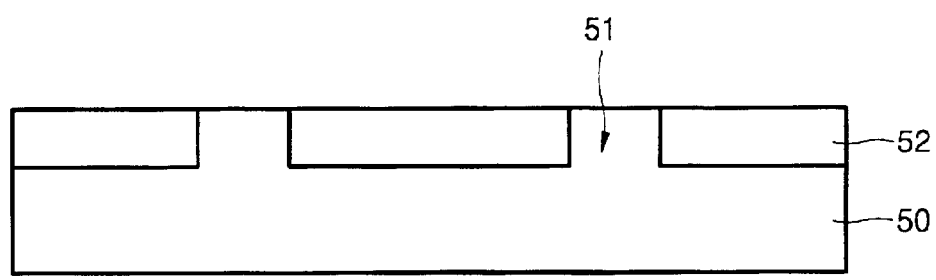
Figure 10D:
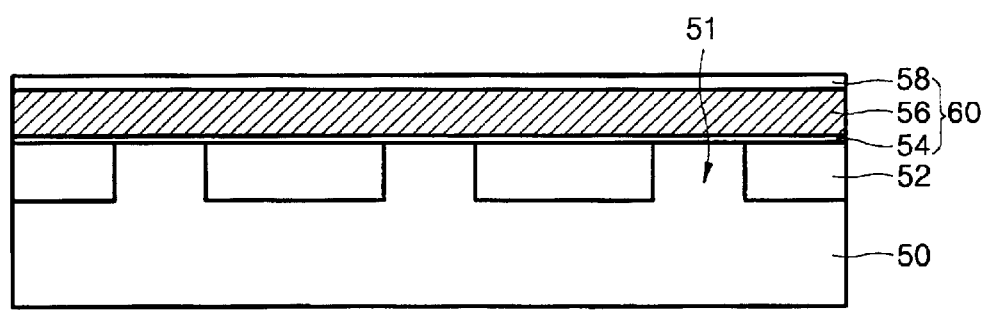
Figure 11A:
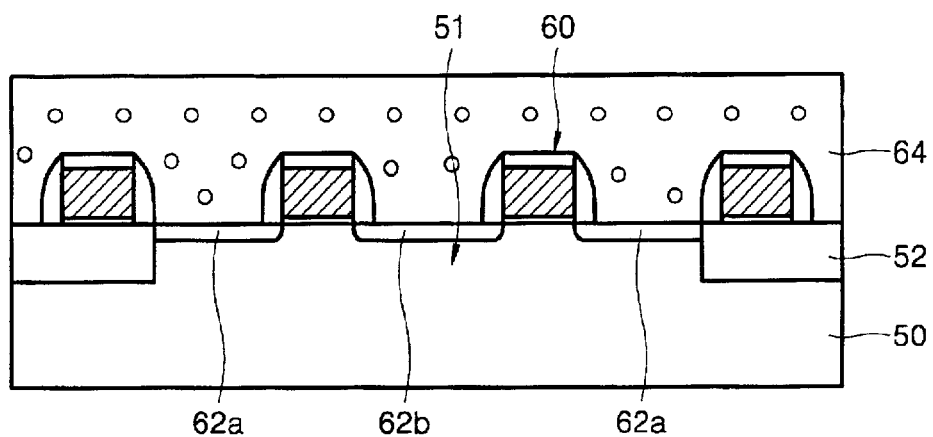
FIGS. 11A through 11D are cross-sectional views of the structure of FIG. 5, taken along lines a–a', b–b', c–c', and d–d', respectively.
Figure 11B:
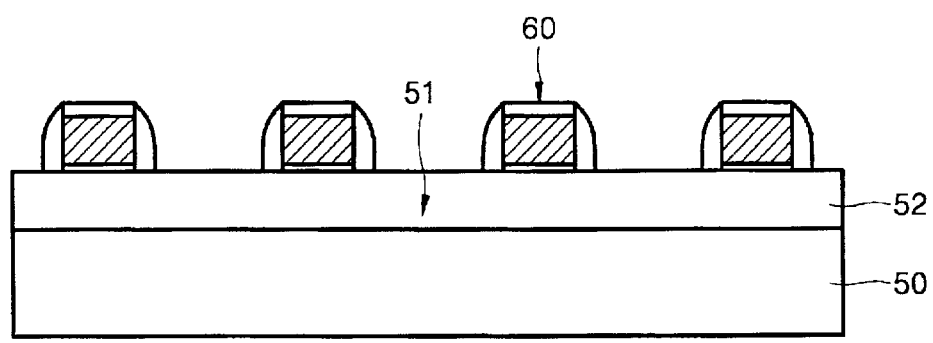
Figure 11C:
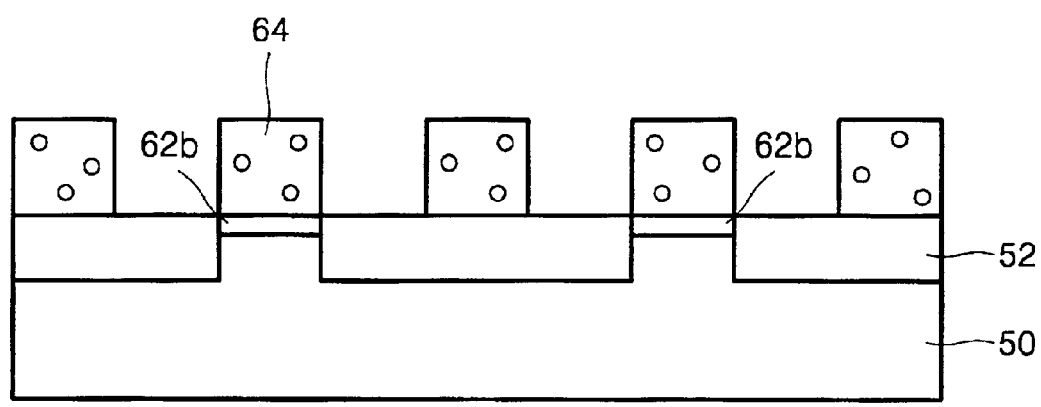
Figure 11D:
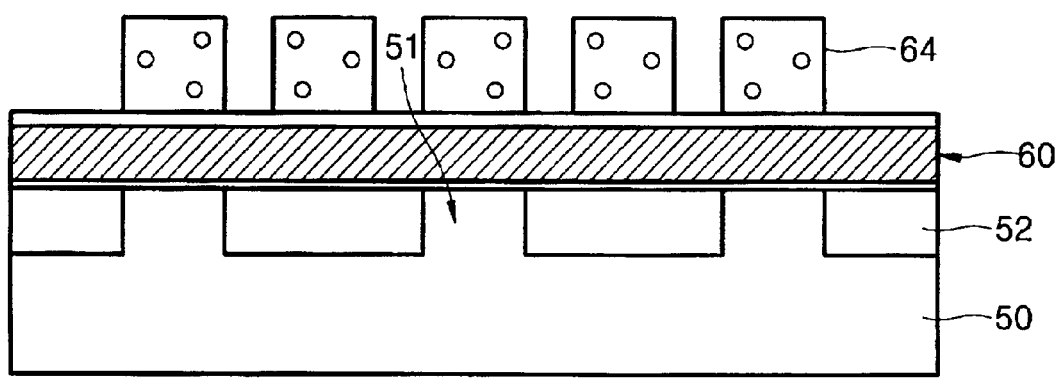
Figure 12A:
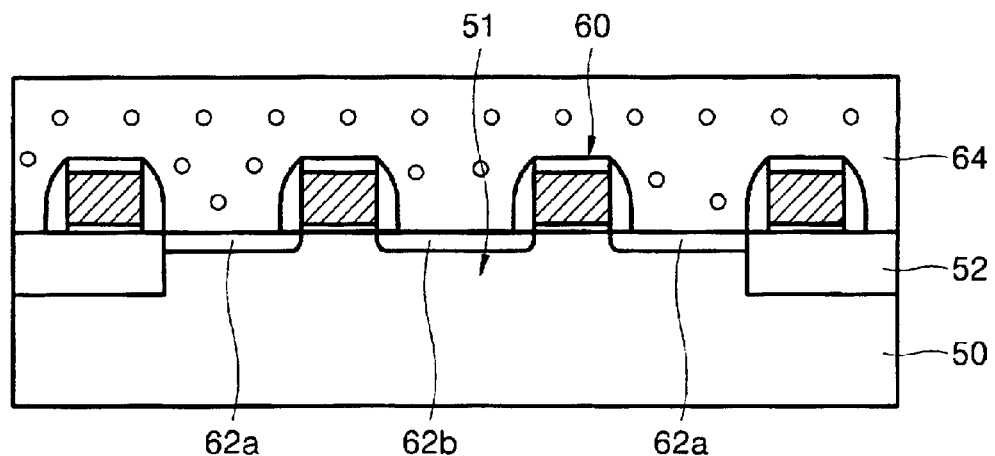
FIGS. 12A through 12D are cross-sectional views of the structure of FIG. 6, taken along lines a–a', b–b', c–c', and d–d', respectively.
Figure 12B:
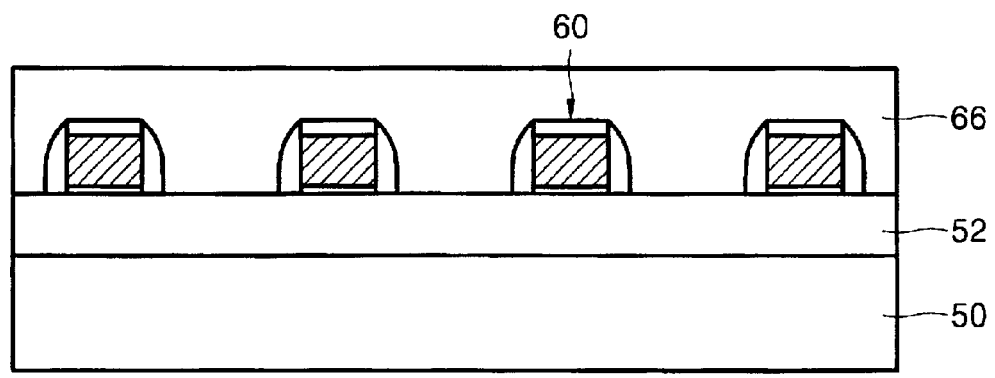
Figure 12C:
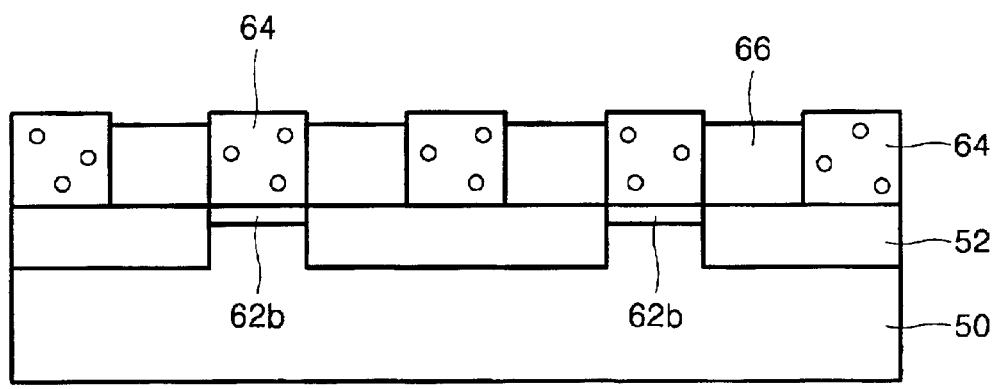
Figure 12D:
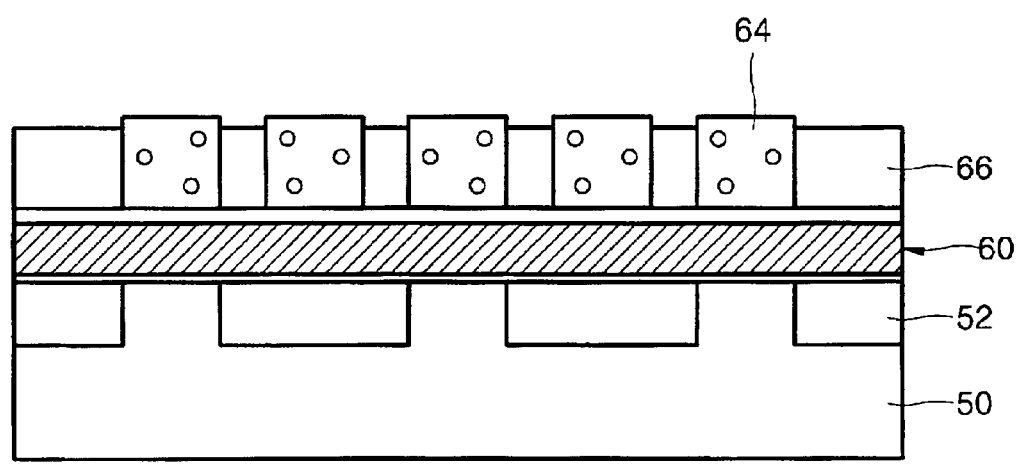
Figure 13A:
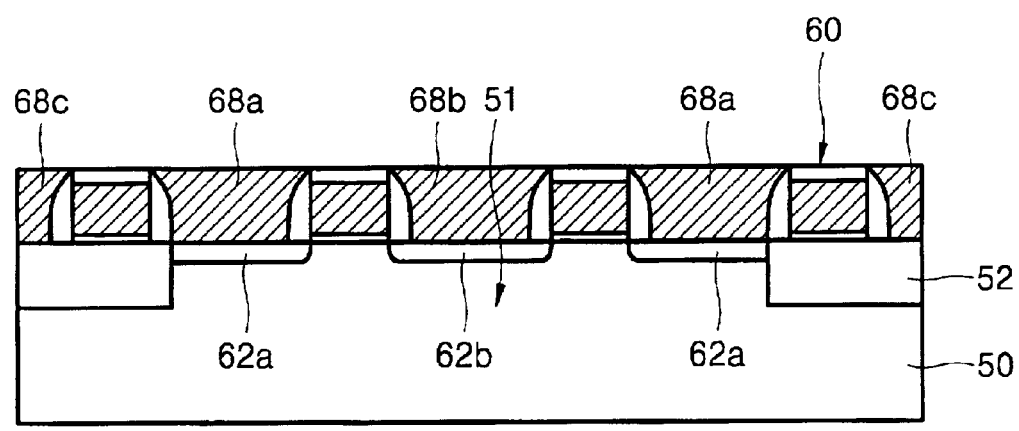
FIGS. 13A through 13D are cross-sectional views of the structure of FIG. 7, taken along lines a–a', b–b', c–c', and d–d', respectively.
Figure 13B:
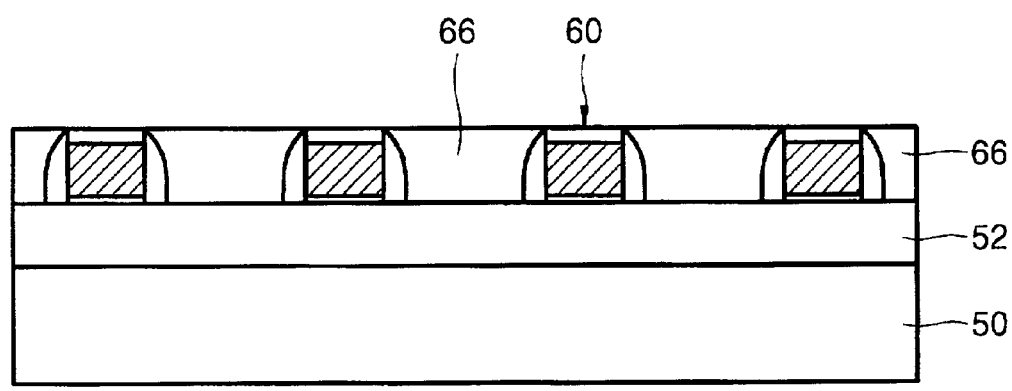
Figure 13C:
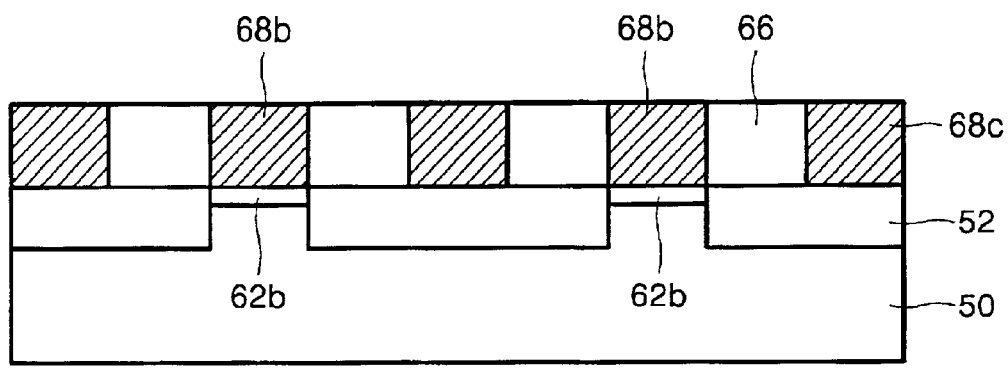
Figure 13D:
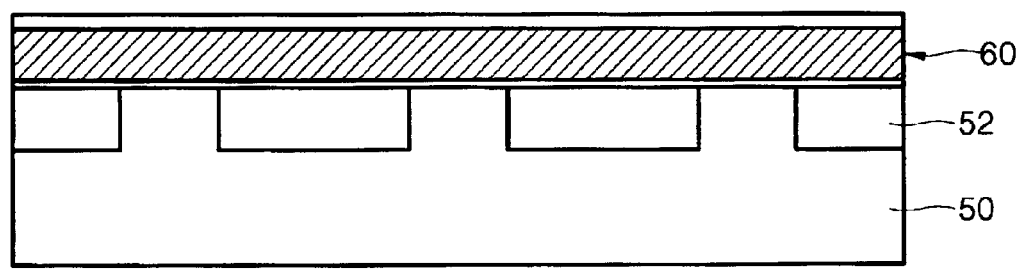

Referring to FIGS. 7 and 13A through 13D, the photoresist patterns 64 may be removed by a well-known plasma ashing method so that the active regions and the isolation layer 52 are exposed through the oxide layer 66. A conductive layer for self-aligned contact pads is deposited on the semiconductor substrate 50 to a thickness sufficient to fill the spaces previously occupied by the photoresist patterns 64. The conductive layer comprises, for example, an impurity-doped polysilicon layer. Next, the conductive layer and the oxide layer 66 are chemically and mechanically polished until the surfaces of the word line structures 60 are exposed, thereby forming first, second, and third self-aligned contact pads 68a, 68b, and 68c in the spaces between the word line structures 60. The first, second, and third self-aligned contact pads 68a, 68b, and 68c are electrically isolated from one another by the word line structures 60 and the oxide layer 66. The first self-aligned contact 68a in contact with the source region 62a and the second self-aligned contact 68b in contact with the drain region 62b are conductive, whereas the third self-aligned contact 68c is floating on the isolation layer 52. The sizes of the first and second self-aligned contacts 68a and 68b may be the same and the third self-aligned contact 68c may be the same size as the first and second self-aligned contacts. As shown in FIG. 7, the first, second, and third self-aligned contact pads 68a, 68b, and 68c are arranged in the horizontal direction.

Figure 14A:
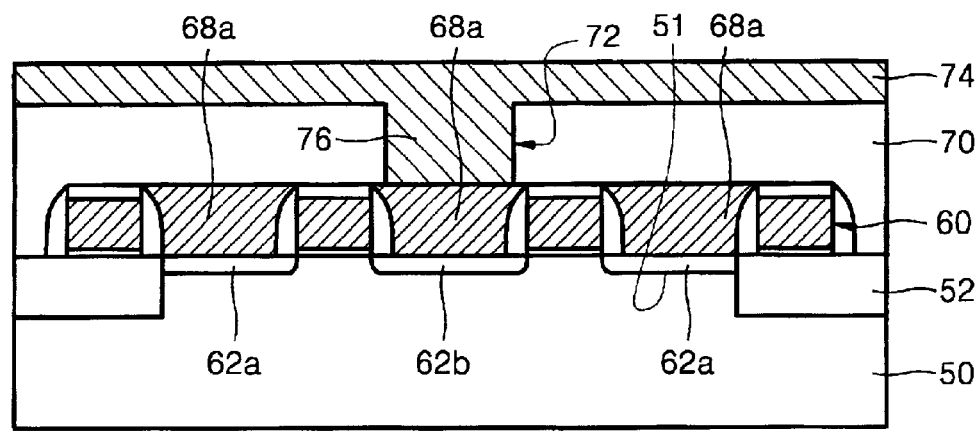
FIGS. 14A through 14D are cross-sectional views of the structure of FIG. 8, taken along lines a–a', b–b', c–c', and d–d', respectively.
Figure 14B:
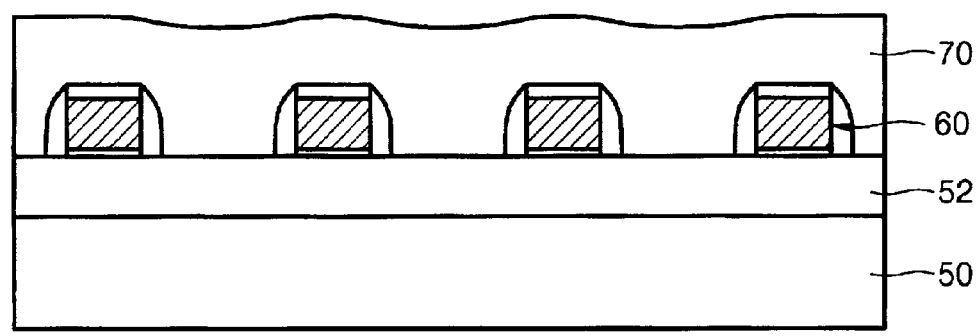
Figure 14C:
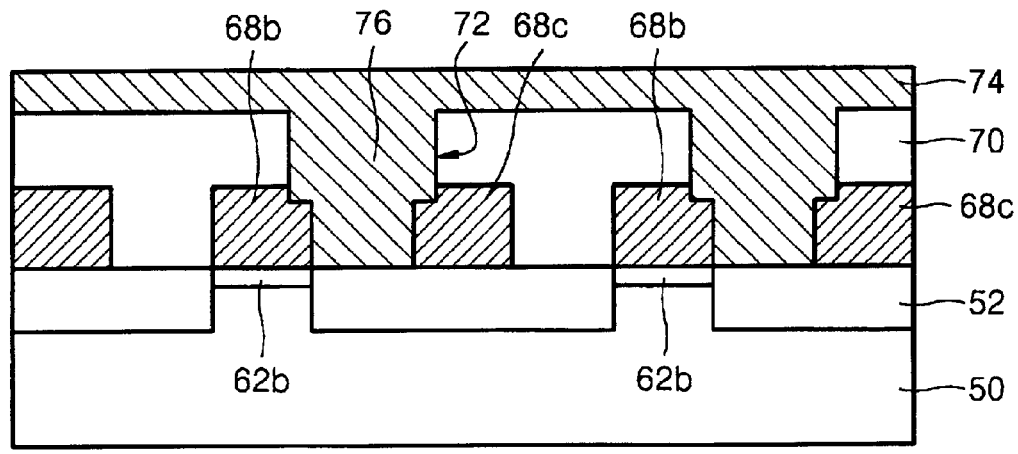
Figure 14D:
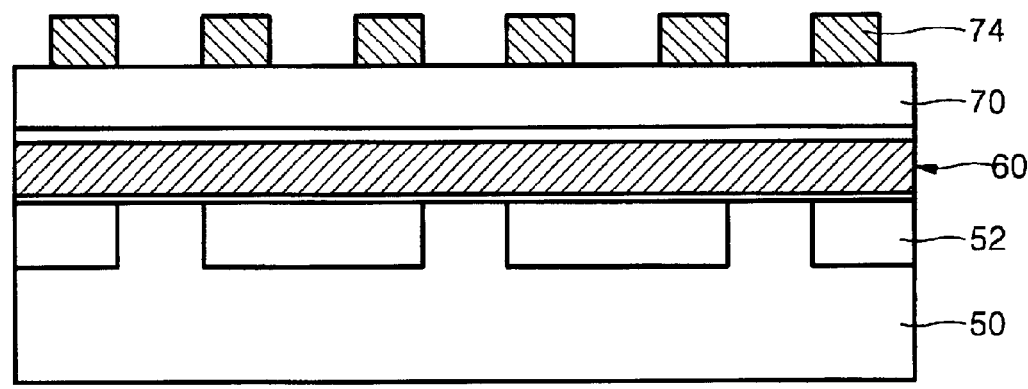

As shown in FIGS. 8 and 14A through 14D, the oxide layer 66 is removed, exposing portions of the isolation layer 52 between the first, second, and third self-aligned contact pads 68a, 68b, and 68c. An interlayer insulating layer 70 is formed on the semiconductor substrate 50 and then etched to expose the second self-aligned contact 68b, thereby forming a bit line contact hole 72. As shown in FIG. 14C, the bit line contact hole 72 is formed so as to expose the second self-aligned contact 68b and the third self-aligned contact 68c. Because an active region 51 belonging to a predetermined row and column is positioned at a location corresponding to a gap between two active regions 51 next to the active region 51, the self-aligned contact adjacent to the second self-aligned contact 68b (in a vertical direction) is the third self-aligned contact 68c floating on the isolation layer 52. Accordingly, even if the second and third self-aligned contact pads 68b and 68c are simultaneously in contact with a bit line, formation of a short can be avoided. In addition, because the bit line contact hole 72 may be formed to expand to the third self-aligned contact 68c as well as the second self-aligned contact 68b, the area of the bit line contact hole 72 can be relatively large. Accordingly, mask alignment for forming the bit line contact hole 72 can be achieved more easily. As shown, the width of the bit line contact hole 72 is greater than the gap between the second and third self-aligned contact pads 68b and 68c.

A conductive layer is formed on the interlayer insulating layer 70, forming a contact plug 76 in the bit line contact hole 72. The conductive layer is patterned so that conductive material remains in spaces between the first, second, and third self-aligned contact pads 68a, 68b, and 68c, which cross the word line structures 60, forming bit lines 74. As shown in FIG. 14C, a bit line 74 contacts the second and third self-aligned contact pads 68b and 68c via the contact plug 76.

As described above, according to some embodiments of the present invention, the photoresist patterns 64 are formed on the cell region except for the rows at which the active regions 51 are formed, in other words, except for the regions at which the bit lines 74 will be formed. The oxide layer 66 is formed to fill spaces between the photoresist patterns 64 at low temperatures. The photoresist patterns 64 are selectively removed, and then a conductive layer is formed so as to sufficiently fill the spaces that were occupied by the photoresist patterns 64. The conductive layer and the oxide layer 66 are chemically and mechanically polished to expose the surfaces of the word line structures 60, thereby forming the self-aligned contact pads 68a, 68b, and 68c. The oxide layer 66 is then removed.

Accordingly, the self-aligned contact pads 68a, 68b, and 68c can be formed without performing a photolithographic process for selectively exposing the active regions 51. Since this photolithographic process can be omitted, problems such as bridge formation can be reduced. In addition, if the photolithographic process for exposing self-aligned contact regions is not performed, each of the self-aligned contact pads 68a, 68b, and 68c can have the same size, which can reduce etching irregularities.

Figure 15:
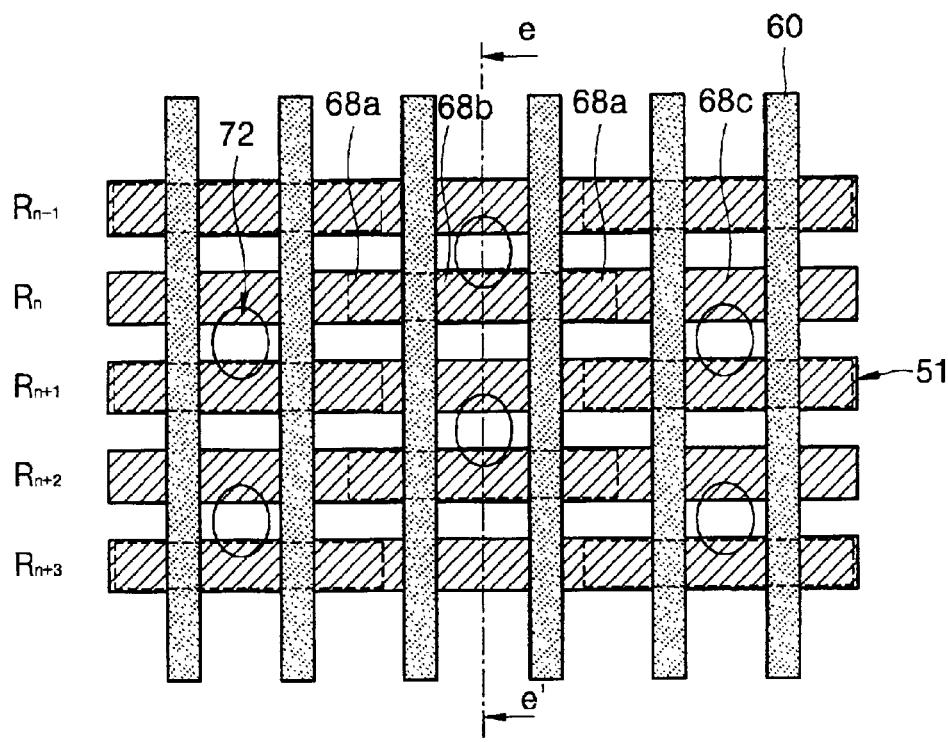
FIG. 15 is a plan view illustrating fabrication products and operations according to further embodiments of the present invention.
Figure 16:
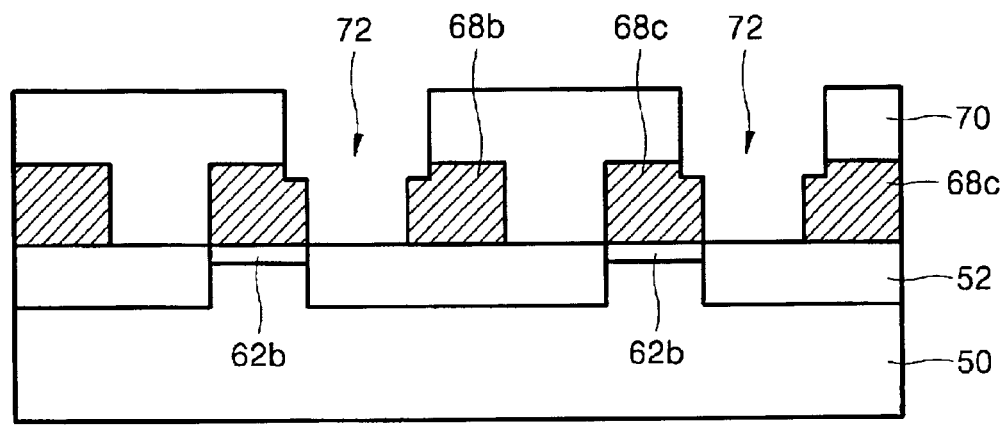
FIG. 16 is a cross-sectional view of the structure of FIG. 15, taken along a line e–e'.

FIGS. 15 and 16 illustrate an alternative arrangement of contact holes 72 according to further embodiments of the present invention. A structure is fabricated as described above with reference to FIGS. 3–7 and 9–13. Referring to FIGS. 15 and 16, portions of an interlayer insulating layer 70 are etched to expose the second self-aligned contact pad 68b in contact with the drain region 62b. In particular, a second self-aligned contact pad 68b belonging to a row Rn and a third self-aligned contact pad 68c, which is floating on an isolation region 52 and belongs to a previous row Rn−1 and is in the same column as the second self-aligned contact pad 68c, are exposed by the same contact hole 72

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An integrated circuit device comprising:

a substrate;

a plurality of rows of active regions in the substrate, the active regions arranged in a staggered pattern such that active regions of a first row are aligned with portions of an isolation region separating active regions of an adjacent second row;

source and drain regions in the active regions arranged such that each active region comprises a drain region disposed between two source regions;

a plurality of word line structures on the substrate, arranged transverse to the rows of active regions such that word line structures cross the active regions between the source regions and the drain regions;

respective rows of separate conductive pads disposed between respective adjacent word line structures, each row of conductive pads including separate first conductive pads on the source regions, second conductive pads on the drain regions, and third conductive pads on isolation regions separating active regions;

an interlayer insulating layer on the substrate; and a plurality of bit line structures on the substrate extending transverse to the word line structures and contacting the second conductive pads, the bit line structures comprising a plurality of conductive plugs extending through the interlayer insulating layer to contact the second conductive pads, wherein the conductive plugs also contact the third conductive pads.

2. A device according to claim 1, wherein the bit line structures comprise conductive lines disposed on the interlayer insulating layer and in contact with the conductive plugs.

3. A device according to claim 2, wherein the word line structures respectively comprise conductive lines that are substantially parallel to one another and wherein the conductive lines of the bit line structures are substantially perpendicular to the conductive lines of the word line structures.

4. A device according to claim 2, wherein the active regions are rectangular.

5. An integrated circuit memory device comprising:

a semiconductor substrate;

an isolation layer defining a plurality of rows of active regions which are arranged a predetermined distance apart on the semiconductor substrate;

a source region formed at a portion of each of the active regions;

a drain region formed at another portion of each of the active regions;

bit lines formed in spaces between the rows at which the active regions are formed so as to be electrically connected to the drain regions and cross the word line structures; and respective rows of separate self-aligned contact pads coinciding with respective rows of the plurality of rows of active regions, each row of contact pads including contact pads on the source and drain regions of the corresponding row of active regions and contact pads on portions of the isolation region between the active regions of the row of active regions, wherein a bit line simultaneously contacts both a self-aligned contact pad in contact with a drain region and a self-aligned contact pad on the isolation layer and belonging to the same column as the self-aligned contact pad in contact with the drain region but to a different row next to the row to which the self-aligned contact pad in contact with the drain region belongs.

6. The integrated circuit memory device of claim 5, wherein one of the active regions belonging to a selected row is arranged at a position corresponding to a gap between two adjacent active regions of the active regions placed at a row next to the selected row.

7. The integrated circuit memory device of claim 5 further comprising word line structures arranged to cross the plurality of active regions so that the source and drain regions are defined.

8. The integrated circuit memory device of claim 7, wherein a pair of word line structures arranged a predetermined distance apart is disposed in each of the plurality of active regions and extends in a column direction.

9. The integrated circuit memory device of claim 8, wherein each of the word line structures comprises:

a gate insulating layer formed on the semiconductor substrate;

a conductive layer formed on the gate insulating layer;

a capping layer formed on the conductive layer; and insulating spacers at either side of the capping layer, conductive layer, and gate insulating layer.

10. The integrated circuit memory device of claim 5 further comprising an insulating layer formed under the bit line.

11. The integrated circuit memory device of claim 10, wherein the self-aligned contact pad in contact with the source region, the self-aligned contact pad in contact with the drain region, and the self-aligned contact pad on the isolation layer are isolated from one another in a row direction by each of the word line structures and are isolated from one another in a column direction by the insulating layer under the bit line.

12. The integrated circuit memory device of claim 5, wherein the self-aligned contact pad in contact with the source region and the self-aligned contact pad in contact with the drain region have the same size.

13. The integrated circuit memory device of claim 5, wherein the self-aligned contact pad in contact with the source region, the self-aligned contact pad in contact with the drain region, and the self-aligned contact pad formed on the isolation layer have the same size.

* * * * *